(12) United States Patent
Crivat et al.

(10) Patent No.: US 7,952,499 B1
(45) Date of Patent: May 31, 2011

(54) RANDOM ACCESS IN RUN-LENGTH ENCODED STRUCTURES

(75) Inventors: Bogdan Crivat, Redmond, WA (US); Cristian Petculescu, Seattle, WA (US); Amir Netz, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 12/696,226

(22) Filed: Jan. 29, 2010

(51) Int. Cl.
H03M 7/46 (2006.01)

(52) U.S. Cl. ............................ 341/63; 341/50; 715/234

(58) Field of Classification Search ............... 341/50, 341/51, 63; 715/234
See application file for complete search history.

(56) References Cited

U.S. PATENT DOCUMENTS

| | | | |
|---|---|---|---|
| 5,734,340 A | 3/1998 | Kennedy | |
| 6,137,428 A | 10/2000 | Cooper | |
| 6,654,503 B1 | 11/2003 | Sudharsanan et al. | |
| 7,043,077 B2 * | 5/2006 | Rijavec | 382/164 |
| 7,372,377 B2 | 5/2008 | Mushano et al. | |
| 7,386,554 B2 * | 6/2008 | Ripley et al. | 1/1 |
| 2001/0039552 A1 * | 11/2001 | Killi et al. | 707/500 |
| 2005/0210145 A1 * | 9/2005 | Kim et al. | 709/231 |
| 2006/0187358 A1 | 8/2006 | Lienhart et al. | |
| 2008/0281984 A1 | 11/2008 | Roberts | |
| 2009/0119594 A1 * | 5/2009 | Hannuksela | 715/723 |

OTHER PUBLICATIONS

Sandfort, et al.,"Labeling of N-Dimensional Images with Choosable Adjacency of the Pixels", Retrieved at<<http://www.wise-t.com/ias/download.php?article_id=239>>,Mar. 2009,pp. 45-61.

Trigdell Andrew, "Efficient Algorithms for Sorting and Synchronization", Retrieved at<<http://www.samba.org/~tridge/phd_thesis.pdf<<, Feb. 1999, pp. 115.

An, Mingyuan, "Column-Based RLE in Row-Oriented Database", Retrieved at<< http://www.ict.ac.cn/diffusive/images/95311451.pdf>>, Oct. 9, 2009, pp. 7.

Carmel et al., "Static Index Pruning for Information Retrieval Systems", Retrieved at<<http://delivery.acm.org/10.1145/390000/383958/p43-carmel.pdf?key1=383958&key2=1092435521&coll=GUIDE&dl=GUIDE&CFID=57308998&CFTOKEN=78227769>>, Sep. 9-12, 2001, pp. 43-50.

Linoff et al., "Compression of Indexes with Full PositionalInformation in Very Large Text Databases", Retrieved at<<http://delivery.acm.org/10.1145/170000/160699/p88-linoff.pdf?key1=160699&key2=4292435521&coll=GUIDE&dl=GUIDE&CFID=57309042& CFTOKEN=13085994>>, 1993, pp. 88-95.

Scholer, et al., "Compression of Inverted Indexes for Fast QueryEvaluation", Retrieved at<<http://delivery.acm. org/10.1145/570000/564416/p222-scholer.pdf?key1=564416&key2=5692435521&coll=GUIDE&dl=GUIDE&CFID=57309072& CFTOKEN=56687650>>, Aug. 11-15, 2002, pp. 222-229.

(Continued)

*Primary Examiner* — Peguy JeanPierre
(74) *Attorney, Agent, or Firm* — Ogilivie Law Firm

(57) ABSTRACT

Random access to run-length encoded data values is provided. A target value is identified by a logical index into a structure of run-length-encoded values. To access the value, a bookmark is selected based on the logical index, on a maximum logical index of the bookmark, and on a specified bookmark distance. An initial run in the structure is located, based on the selected bookmark. A final run is chosen, at most one bookmark distance from the initial run. The target value is the value of the final run. Efficiency heuristics are used when generating bookmarks or creating the structure of run-length-encoded values.

20 Claims, 5 Drawing Sheets

---

STORAGE MEDIA 112 IN
ONE OR MORE SYSTEMS 102

BOOKMARKS 202 FOR ARRAY 204 OF RUN(S) 130,
EACH BOOKMARK HAVING ORDINAL 206 AND LAST INDEX 208

ENCODING CODE 210     BOOKMARK-GENERATING CODE 212

BOOKMARK-USING VALUE-LOCATING CODE 214

HEURISTIC(S) 216 FOR
BOOKMARK_DISTANCE 218, AVERAGE_RUN_LENGTH 220

OTHER PUBLICATIONS

Anh, et al., "Index Compression using Fixed Binary Codewords", Retrieved at<<http://delivery.acm.org/10.1145/1020000/1012301/p61-anh.pdf?key1=1012301&key2=3792435521&coll=GUIDE&dl=GUIDE&CFID=56078593&CFTOKEN=81351148>>, 2004, pp. 61-67.

Buttcher, et al., "Index Compression is Good, Especially for Random Access", Retrieved at<<http://delivery.acm.org/10.1145/1330000/1321546/p761-buettcher.pdf?key1=1321546&key2=1492435521&coll=GUIDE&dl=GUIDE&CFID=56078608&CFTOKEN=63511486>>, Nov. 6-8, 2007, pp. 761-770.

* cited by examiner

| VALUE | A | B | C | D | ... | Z |
|---|---|---|---|---|---|---|
| COUNT | 100 | 47 | 22 | 45 | ... | 93 |

Fig. 5

| BOOKMARK INDEX | COVERAGE RANGE | ORDINAL | LAST INDEX |
|---|---|---|---|
| 1 | 1-55 | 1 (INDEX OF THE Ax100 RLE RUN) | 100 (THE LAST INDEX ACCESSIBLE IN THE RUN INDICATED BY ORDINAL) |
| 2 | 56-110 | 1 (SAME AS ABOVE) | 100 (SAME AS ABOVE) |
| 3 | 111-165 | 2 (INDEX OF THE Bx47 RLE RUN, WHICH CONTAINS THE 111$^{TH}$ VALUE IN THE UNCOMPRESSED DATA) | 147 (THE LAST INDEX ACCESSIBLE IN THE RUN INDICATED BY ORDINAL) |
| 4 | 166-220 | 2 (INDEX OF THE Cx22 RLE RUN, WHICH CONTAINS THE 166$^{TH}$ VALUE IN THE UNCOMPRESSED DATA) | 169 (SEE ABOVE) |

Fig. 6

```
procedure RandomAccess(int index)
    // access the appropriate bookmark
    set bookmarkIndex = index / bookmarkDistance // determine which logical index is directly accessible from the RLE run pointed by the bookmark
    set currentRunLastIndex = AllBookmarks[ bookmarkIndex ].LastIndex // read the current RLE run in the compressed data stream
    set currentRLERun = AllRLERuns[ AllBookmarks[bookmarkIndex].Ordinal ]

// determine distance between the index we seek and the index directly accessible in current RLE run
    set offset =         index - currentRunLastIndex // while the desired index is not directly accessible
    while offset >= 0
        // move to the next RLE run
        currentRLERun =      NextRLERun // substract from the remaining distance the count of values in the current RLE run
        offset -=       currentRLERun.Length
    end // the loop terminates when the current RLE run covers the desired index
    // the Value property of the current RLE run is the desired value
    set RequestedValue =      currentRLERun.Value
end procedure
```

Fig. 8

RANDOM ACCESS IN RUN-LENGTH ENCODED STRUCTURES

BACKGROUND

Data compression encodes data (a.k.a. source data, raw data, or uncompressed data) by transforming the data into a form which is smaller than the untransformed data. Reducing the size of the data helps conserve resources such as disk storage space and transmission bandwidth. However, compressed data is often decompressed before use, and the processing resources needed for decompression can be expensive. Accordingly, data encoding schemes (a.k.a. compression techniques) may involve tradeoffs between factors such as the degree of compression, the amount of distortion (if any) created by compression, and the computational resources used to compress and uncompress the data.

Run-length encoding (RLE) is a particular kind of data compression, in which each run of identical data values is stored as a single copy of the data value plus a count, rather than as the original run. A run is a sequence of copies of a single value. For instance, raw data AABBBCAAAA would be stored as four runs, which can be represented as A2B3C1A4, or as (2,A),(3,B),(1,C),(4,A), for example. Raw data need not be text; it can be pixels, records, or any other digital data.

Run-length encoding does not necessarily compress data. The amount of compression (or expansion) actually caused by run-length encoding depends on how many runs there are in the raw data, and how long those runs are. Nonetheless, run-length encoding is used in various fields to compress pixel data, hard disk images, sparse matrices, and/or other raw data.

SUMMARY

Random access into a collection of data values can be more efficient than forms of access which traverse numerous values before reaching the desired value. However, random access can be impeded by data storage choices. A hard drive is generally better suited to random access than a tape drive, for example. Uncompressed data is also often better suited to random access than compressed data.

Fortunately, some embodiments described herein provide ways to obtain random access to run-length encoded data. Random access involves identifying a target value from a given logical index into a structure of run-length-encoded values. The encoded structure includes runs which each have a value property and a count property indicating the number of times the value is repeated in the uncompressed data. Bookmarks are associated with the compressed data; the bookmarks may be generated as the data is compressed, or they may be generated after data compression. To access the value at the given logical index, a bookmark is selected, based on the logical index, a maximum logical index of the bookmark, and a specified bookmark distance. An initial run in the structure of run-length-encoded values is located, based on the selected bookmark. A final run is chosen, namely, a run which is within one bookmark distance of the initial run and which covers a range of logical indexes that includes the given logical index. The target value is then identified, as the value of the final run. Heuristics may be used when generating bookmarks and/or when creating the structure of run-length-encoded values, to facilitate efficient access to encoded target values.

The examples given are merely illustrative. This Summary is not intended to identify key features or essential features of the claimed subject matter, nor is it intended to be used to limit the scope of the claimed subject matter. Rather, this Summary is provided to introduce—in a simplified form— some concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

FIG. 5 is a diagram illustrating a particular run-length encoded structure;

FIG. 6 is a diagram illustrating one of the possible bookmark arrays corresponding to the run-length encoded structure in FIG. 5;

FIG. 8 is a pseudocode listing illustrating some embodiments.

DETAILED DESCRIPTION

Overview

Figure 1:
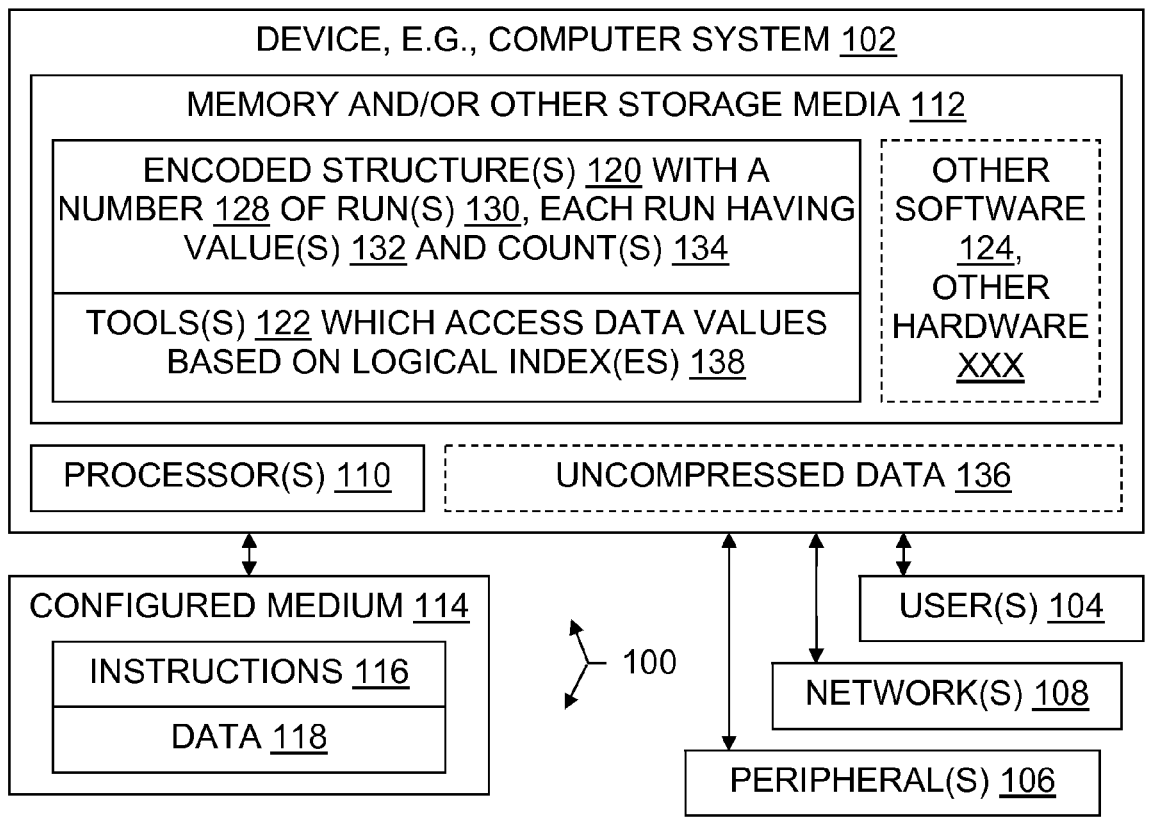
FIG. 1 is a block diagram illustrating a computer system having at least one processor, at least one memory, at least one run-length encoded structure, and other items in an operating environment which may be present on multiple network nodes, and also illustrating configured storage medium embodiments.

Run-length encoding is a data compression method which groups records by their values, and then replaces a contiguous set of records having the same value with a tuple called a "run". A run includes one value plus a count indicating the number of contiguous records that share the value. Random access to such a compressed structure may involve logical reconstruction of the uncompressed data, by scanning the lengths of all sequential runs until the target index is reached. However, such scanning can be expensive.

Some embodiments described herein provide a mechanism for fast random access to run-length encoded (RLE) compressed streams which can yield significantly improved performance over simple scanning approaches. In one embodiment, a vector of equidistant bookmarks is built as data is encoded in the run-length format. Each bookmark contains an index into the set of RLE runs, and the number of remaining values in the run addressed by the bookmark. Random access involves identifying the correct bookmark (based on the requested index), and then performing sequential run scanning. However, scanning need be done for at most the number of runs between two consecutive bookmarks before the target value is found. The bookmarks hold the number of remaining values in the RLE run after the bookmark index.

In some embodiments, a bookmark system is built as data is being compressed in the RLE format; in others, bookmarks are generated for data that has already been compressed. In some embodiments, the bookmarks are equidistant, and in particular, the bookmark distance may be a power of 2.

Reference will now be made to exemplary embodiments such as those illustrated in the drawings, and specific language will be used herein to describe the same. But alterations and further modifications of the features illustrated herein, and additional applications of the principles illustrated herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage, in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise their right to their own lexicography. Terms may be defined, either explicitly or implicitly, here in the Detailed Description and/or elsewhere in the application file.

As used herein, a "computer system" may include, for example, one or more servers, motherboards, processing nodes, personal computers (portable or not), personal digital assistants, cell or mobile phones, and/or device(s) providing one or more processors controlled at least in part by instructions. The instructions may be in the form of software in memory and/or specialized circuitry. In particular, although it may occur that many embodiments run on workstation or laptop computers, other embodiments may run on other computing devices, and any one or more such devices may be part of a given embodiment.

A "multithreaded" computer system is a computer system which supports multiple execution threads. The term "thread" should be understood to include any code capable of or subject to synchronization, and may also be known by another name, such as "task," "process," or "coroutine," for example. The threads may run in parallel, in sequence, or in a combination of parallel execution (e.g., multiprocessing) and sequential execution (e.g., time-sliced). Multithreaded environments have been designed in various configurations. Execution threads may run in parallel, or threads may be organized for parallel execution but actually take turns executing in sequence. Multithreading may be implemented, for example, by running different threads on different cores in a multiprocessing environment, by time-slicing different threads on a single processor core, or by some combination of time-sliced and multi-processor threading. Thread context switches may be initiated, for example, by a kernel's thread scheduler, by user-space signals, or by a combination of user-space and kernel operations. Threads may take turns operating on shared data, or each thread may operate on its own data, for example.

A "logical processor" or "processor" is a single independent hardware thread-processing unit. For example a hyper-threaded quad core chip running two threads per core has eight logical processors. Processors may be general purpose, or they may be tailored for specific uses such as graphics processing, signal processing, floating-point arithmetic processing, encryption, I/O processing, and so on.

A "multiprocessor" computer system is a computer system which has multiple logical processors. Multiprocessor environments occur in various configurations. In a given configuration, all of the processors may be functionally equal, whereas in another configuration some processors may differ from other processors by virtue of having different hardware capabilities, different software assignments, or both. Depending on the configuration, processors may be tightly coupled to each other on a single bus, or they may be loosely coupled. In some configurations the processors share a central memory, in some they each have their own local memory, and in some configurations both shared and local memories are present.

"Kernels" include operating systems, hypervisors, virtual machines, and similar hardware interface software.

"Code" means processor instructions, data (which includes constants, variables, and data structures), or both instructions and data.

"Automatically" means by use of automation (e.g., general purpose computing hardware configured by software for specific operations discussed herein), as opposed to without automation. In particular, steps performed "automatically" are not performed by hand on paper or in a person's mind; they are performed with a machine.

Throughout this document, use of the optional plural "(s)" means that one or more of the indicated feature is present. For example, "structure(s)" means "one or more structures" or equivalently "at least one structure".

Whenever reference is made to data or instructions, it is understood that these items configure a computer-readable memory thereby transforming it to a particular article, as opposed to simply existing on paper, in a person's mind, or as a transitory signal on a wire, for example.

Operating Environments

With reference to FIG. 1, an operating environment 100 for an embodiment may include a computer system 102. The computer system 102 may be a multiprocessor computer system, or not. An operating environment may include one or more machines in a given computer system, which may be clustered, client-server networked, and/or peer-to-peer networked.

Human users 104 may interact with the computer system 102 by using displays, keyboards, and other peripherals 106. System administrators, developers, engineers, and end-users are each a particular type of user 104. Automated agents acting on behalf of one or more people may also be users 104. Storage devices and/or networking devices may be considered peripheral equipment in some embodiments. Other computer systems not shown in FIG. 1 may interact with the computer system 102 or with another system embodiment using one or more connections to a network 108 via network interface equipment, for example.

The computer system 102 includes at least one logical processor 110. The computer system 102, like other suitable systems, also includes one or more computer-readable non-transitory storage media 112. The media 112 may be volatile memory, non-volatile memory, fixed in place media, removable media, magnetic media, optical media, and/or of other types of non-transitory media (as opposed to transitory media such as a wire that merely propagates a signal). In particular, a configured medium 114 such as a CD, DVD, memory stick, or other removable non-volatile memory medium may become functionally part of the computer system when inserted or otherwise installed, making its content accessible for use by processor 110. The removable configured medium 114 is an example of a computer-readable storage medium 112. Some other examples of computer-readable storage media 112 include built-in RAM, ROM, hard disks, and other storage devices which are not readily removable by users 104. Media 112 may be of different physical types.

The medium 114 is configured with instructions 116 that are executable by a processor 110; "executable" is used in a broad sense herein to include machine code, interpretable code, and code that runs on a virtual machine, for example. The medium 114 is also configured with data 118 which is created, modified, referenced, and/or otherwise used by execution of the instructions 116. The instructions 116 and the data 118 configure the medium 114 in which they reside; when that memory is a functional part of a given computer system, the instructions 116 and data 118 also configure that computer system. In some embodiments, a portion of the data 118 is representative of real-world items such as product characteristics, inventories, physical measurements, settings, images (still and/or video), readings, targets, volumes, and so forth. Such data is also transformed by as discussed herein, e.g., by compression, decompression, indexing, binding, deployment, execution, modification, display, creation, loading, and/or other operations.

Compressed data in the form of encoded structure(s) 120, tool(s) 122 for using data (possibly after decompressing it), other software 124, and other items shown in the Figures may reside partially or entirely within one or more media 112, thereby configuring those media. An operating environment may also include other hardware 126, such as buses, power supplies, and accelerators, for instance.

Run-length encoded structure(s) 120 include a number 128 of run(s) 130. Each run 130 has a value 132 and a count 134 indicating how many times that value appeared consecutively in the uncompressed version of the data. The uncompressed data 136 may be stored on the same system 102 as the compressed data (structure 120), but uncompressed data may also be stored elsewhere in some cases.

The tools 122 may create an uncompressed copy of the data 136 in order to access data values 132 located at a given logical index 138. The term "logical index" refers to a location in the uncompressed data 136. Use of "logical index" does not imply that uncompressed data must be local, or event that it must exist; "logical index" can refer to the location where the value would be found if uncompressed data was obtained by decompressing the compressed data structure 120.

In some embodiments, the software 124 found in a given operating environment 100 includes an Integrated Development Environment (IDE) which provides a developer with a set of coordinated software development tools. In particular, some of the suitable operating environments for some embodiments include or help create a Microsoft® Visual Studio® development environment (marks of Microsoft Corporation) configured to support program development. Some suitable operating environments include Java® environments (mark of Sun Microsystems, Inc.), and some include environments which utilize languages such as C++ or C# ("C-Sharp"), but teachings herein are applicable with a wide variety of programming languages, programming models, and programs, as well as with endeavors outside the field of software development per se that use data compression and/or decompression technology.

Some items are shown in outline form in FIG. 1 to emphasize that they are not necessarily part of the illustrated operating environment, but may interoperate with items in the operating environment as discussed herein. It does not follow that items not in outline form are necessarily required, in any Figure or any embodiment.

Systems

Figure 2:
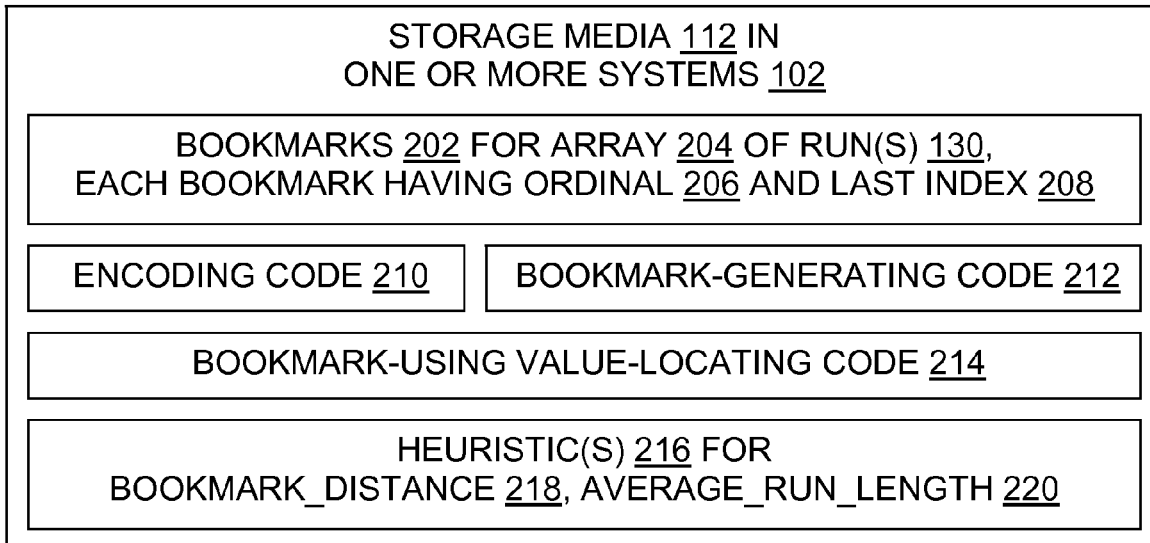
FIG. 2 is a block diagram illustrating example architectures for random access to run-length encoded values.

FIG. 2 illustrates an architecture which is suitable for use with some embodiments. An array, tree, list, vector, table, or other collection of bookmarks 202 is used in a manner described herein to access values 132 in an array 204 which serves as a run-length encoded structure 120. Although reference is often made herein to arrays, it will be understood that other data structures (tree, list, table, etc.) can often be used in an equivalent manner for the purposes discussed herein. Each bookmark 202 covers a range of logical indexes 138. Each bookmark 202 has an ordinal 206 identifying the ordinal position in the array 204 of the first run 130 that starts at a logical index 138 covered by the bookmark. Each bookmark 202 also has a last_index 208 identifying the maximum logical index 138 of the run 130 that is identified by the ordinal 206.

Some embodiments include encoding code 210 to perform run-length encoding of raw data 136. Some embodiments include bookmark-generating code 212 for generating bookmarks 202. Some embodiments include bookmark-using value-locating code 214 for locating values 132 in encoded data structures 120 by using bookmarks 202. A particular embodiment may include only bookmark-generating code 212, include only bookmark-using value-locating code 214, or include both. In addition, an embodiment may or may not contain encoding code 210.

Some embodiments use a heuristic 216 for selecting a bookmark_distance 218 that defines the size of the range of logical indexes 138 covered by a bookmark 202. Some embodiments use a heuristic 216 for selecting an average_run_length 220 when encoding data 136 to form an encoded structure 120. Some embodiments use both types of heuristic 216; some use neither.

Figure 4:
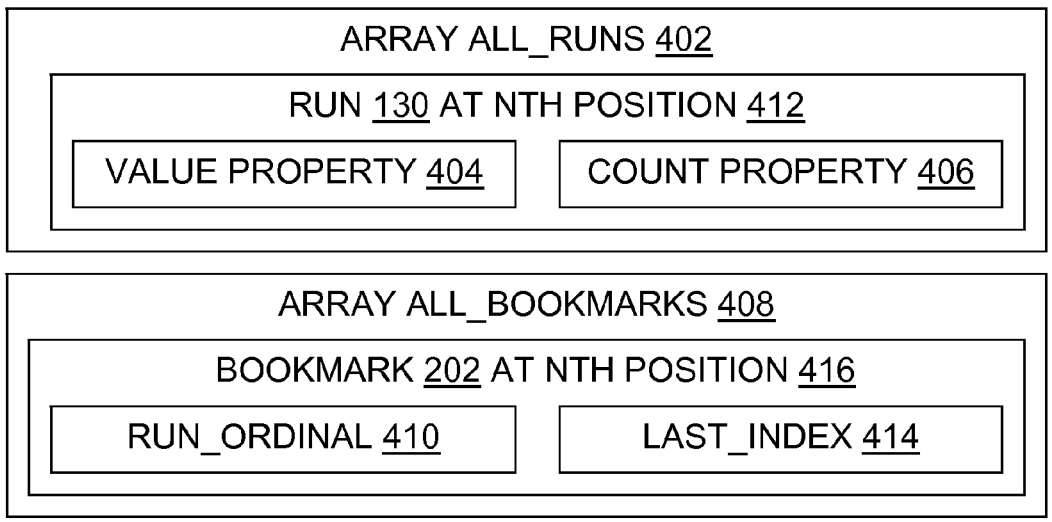
FIG. 4 is a block diagram further defining a FIG. 2 architecture by illustrating an array of run-length encoded values and an array of bookmarks.

With reference now to FIGS. 1, 2, and 4, some embodiments provide a computer system 102 with a logical processor 110 and a memory medium 112 configured by circuitry, firmware, and/or software to compress data, decompress data, and/or access data as described herein.

For example, one embodiment of a run-length-encoding management system includes at least one logical processor 110, and at least one memory in operable communication with the logical processor. The embodiment also includes an array 204 all_runs 402 of run-length-encoded values 132 residing in memory and accessible to the logical processor. The array all_runs includes runs which each have a value property 404 and a count property 406 indicating the number of times (the count 134) the value 132 in question is repeated in an uncompressed data 136 source. The embodiment also includes a set of bookmarks 202 (e.g., an array all_bookmarks 408) residing in memory and accessible to the logical processor. Each bookmark 202 for a logical index i into the data 136 source has an ordinal 206 (e.g., a run_ordinal 410 variable) specifying an ordinal position 412 in the array all_runs, namely, the ordinal position of the run 130 containing the value at logical index i. The bookmark 202 also has a last index 208 (e.g., a last_index 414 variable) specifying the maximum logical index 138 covered by the run 130 at the bookmark's run_ordinal position 412 in all_runs. Each bookmark 202 also has a position 416 in the set of bookmarks.

With reference now to FIGS. 1 through 4, some embodiments provide a system that includes code 214 residing in memory and configured to access a value 132 at a logical index i supplied to the code as a parameter. The code 214 uses 312 bookmark(s) 202 to locate the value in the array all_runs 402. That is, some systems include code for random access into the encoded values.

It will be understood that arrays (or other data structures) which have names other than "all_runs" but are otherwise consistent with the functionality of a given embodiment, are interchangeable with and equivalent to the array all_runs discussed in examples herein. Similar interchangability and equivalence considerations apply to other variables or constants given names herein for convenience, e.g., run_ordinal, last_index, all_bookmarks, bookmark_distance, and average_run_length. Infringement may not be avoided by simply choosing different names for software components.

In some embodiments, the code 214 is configured to use 312 the bookmark(s) to find a target value by selecting 314 a bookmark 202 based on the given logical index 138 parameter and a specified bookmark_distance 218, locating 316 an initial run 130 in the array all_runs based on the selected bookmark, choosing 318 as a final run a run which is within one bookmark_distance of the initial run and which covers a range of logical indexes that includes the given logical index, and identifying 320 the target value as the value of the final run. In some embodiments, the code 214 selects 314 the bookmark which is located at a particular position 416 in an ordered sequence of bookmarks, such as array all_bookmarks 408. The particular position is the given logical index parameter divided by bookmark_distance, using integer division.

In some embodiments, each bookmark 202 covers a contiguous range of bookmark_distance logical indexes, and is thus identified by each of those indexes. Each bookmark 202 identified by a logical index i has a run_ordinal 410 specifying the ordinal position 412 in all_runs of the run 130 containing the value at logical index i. Each bookmark 202 identified by a logical index i also has a last_index 414 specifying the maximum logical index covered by the run 130 at the bookmark's run_ordinal position in all_runs. The code 214 uses the bookmark(s) by selecting 314 a bookmark as the given logical index parameter divided by the bookmark_distance using integer division, and by locating 316 an initial run as all_runs[all_bookmarks[bookmark_index].run_ordinal].

In some embodiments, each bookmark 202 covers a contiguous range of bookmark_distance logical indexes 138, and bookmark_distance is a positive integer power of two. These bookmark_distance values (powers of two) are an example of a heuristic 216 for bookmark_distance 218.

In addition to code 214 for using bookmarks to identify target values 132, some embodiments include code 212 residing in memory and configured to generate the bookmark(s) 202.

In some embodiments, a given run-length encoding can have more than one set of bookmarks. E.g., one may have a choice, at random access time, between different values of bookmark_distance. Some embodiments have different sets of bookmarks across different segments of data. Having a single bookmark distance may slow accesses. However, some embodiments segment uncompressed data 136 about every one million records, so each segment has its own bookmark system, as part of a heuristic for setting an average_run_length, and give each segment its own set of bookmarks.

In some embodiments peripherals 106 such as human user I/O devices (screen, keyboard, mouse, tablet, microphone, speaker, motion sensor, etc.) will be present in operable communication with one or more processors 110 and memory. However, an embodiment may also be deeply embedded in a system, such that no human user 104 interacts directly with the embodiment. Software processes may be users 104.

In some embodiments, the system includes multiple computers connected by a network. Networking interface equipment can provide access to networks 108, using components such as a packet-switched network interface card, a wireless transceiver, or a telephone network interface, for example, will be present in a computer system. However, an embodiment may also communicate through direct memory access, removable nonvolatile media, or other information storage-retrieval and/or transmission approaches, or an embodiment in a computer system may operate without communicating with other computer systems.

Processes

Figure 3:
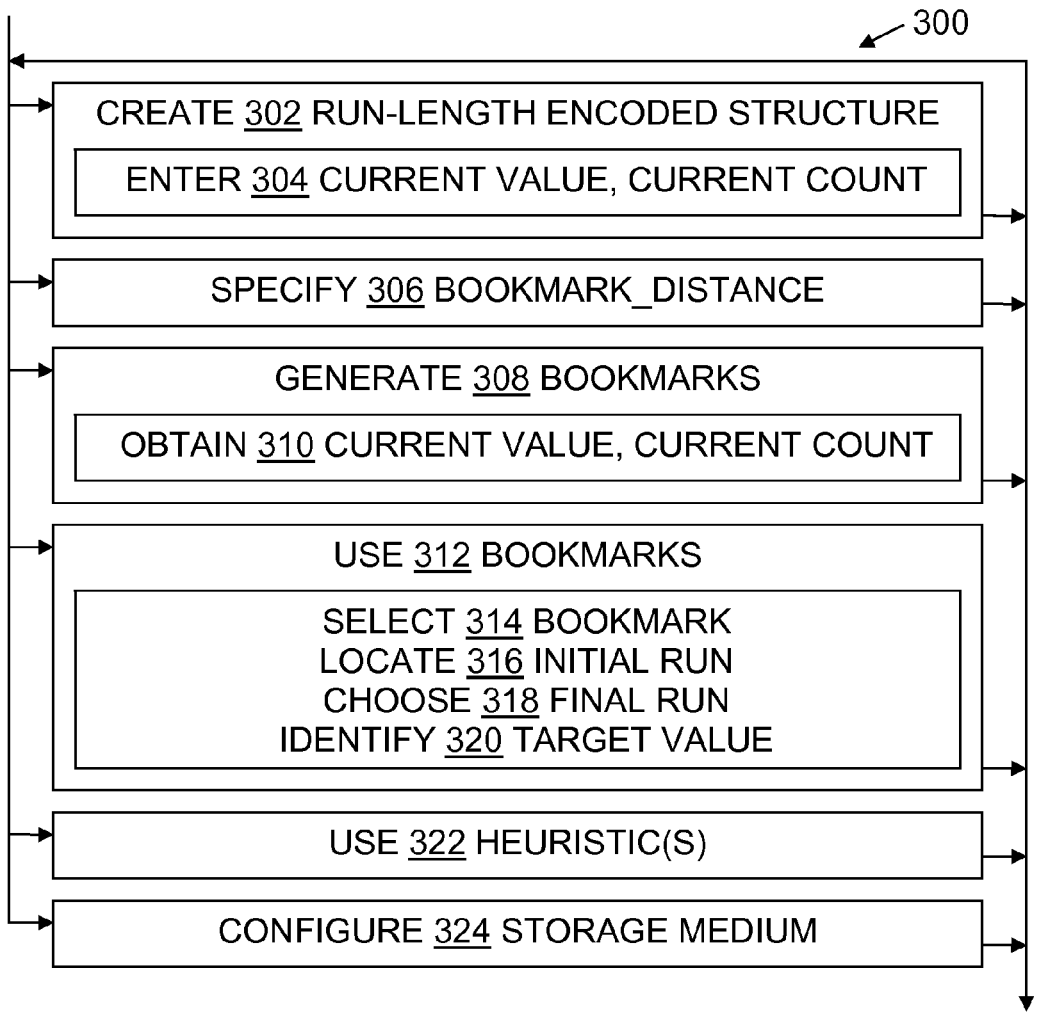
FIG. 3 is a flow chart illustrating steps of some process and configured storage medium embodiments.

FIG. 3 illustrates some process embodiments in a flowchart 300. Processes shown in the Figures may be performed in some embodiments automatically, e.g., by bookmark-generating code 212 and/or bookmark-using code 214 under control of a script requiring little or no user input. Processes may also be performed in part automatically and in part manually unless otherwise indicated. In a given embodiment zero or more illustrated steps of a process may be repeated, perhaps with different parameters or data to operate on. Steps in an embodiment may also be done in a different order than the top-to-bottom order that is laid out in FIG. 3. Steps may be performed serially, in a partially overlapping manner, or fully in parallel. The order in which flowchart 300 is traversed to indicate the steps performed during a process may vary from one performance of the process to another performance of the process. The flowchart traversal order may also vary from one process embodiment to another process embodiment. Steps may also be omitted, combined, renamed, regrouped, or otherwise depart from the illustrated flow, provided that the process performed is operable and conforms to at least one claim.

Examples are provided herein to help illustrate aspects of the technology, but the examples given within this document do not describe all possible embodiments. Embodiments are not limited to the specific implementations, arrangements, displays, features, approaches, or scenarios provided herein. A given embodiment may include additional or different features, mechanisms, and/or data structures, for instance, and may otherwise depart from the examples provided herein.

During a structure creating step 302, an embodiment creates a run-length encoded structure 120. Step 302 may be accomplished using parsing, counting, or other familiar mechanisms, for example. In particular, step 302 generally includes instances of a step 304 of entering a current value 132 and current count 134 for each of multiple runs 130 found in raw data 136.

During a bookmark distance specifying step 306, an embodiment specifies at least one bookmark_distance 218 in association with a structure 120 and a set of bookmarks 202.

During a bookmark generating step 308, an embodiment generates a set of bookmark(s) 202. Bookmarks may be generated from previously encoded data, or they may be generated 308 as raw data is being encoded.

During a using step 312, an embodiment uses bookmark(s) 202 to perform random access, namely, to access a target value 132 at a specified logical index 138 in run-length encoded data. Step 312 may include selecting 314 a bookmark, locating 316 an initial run, choosing 318 a final run (which may be in some cases the same as the initial run), and then identifying 320 the target value.

During a heuristics using step 322, an embodiment uses one or more heuristics 216. Use may be made by choosing a bookmark_distance 218 which matches specified heuristic criteria (e.g., being a power of two), by employing such a matching bookmark_distance 218 during another step (e.g., while using 312 bookmarks for random access), by choosing an average_run_length 220 which matches specified heuristic criteria (e.g., being greater than sixty-four), and/or by employing such a matching average_run_length 220 during another step (e.g., while generating 308 bookmarks for random access).

During a memory configuring step 324, a memory medium 112 is configured by an bookmark(s) 202, bookmark-generating code 212, bookmark-using code 214, or otherwise in connection with a random access to run-length encoded data as discussed herein.

The foregoing steps and their interrelationships are discussed in greater detail below, in connection with various embodiments.

Some embodiments provide a process for identifying a target value from a given logical index 138 into a structure 120 of run-length-encoded values 132. The process selects 314 a bookmark 202 based on the given logical index, a maximum logical index of the bookmark, and a specified bookmark_distance, and locates 316 an initial run in the structure of run-length-encoded values, based on the selected bookmark. The process chooses 318, as a final run, a run which is within one bookmark_distance of the initial run and which covers a range of logical indexes that includes the given logical index. Then the process identifies 320 the target value as the value of the final run.

In some embodiments, the selecting step 314 selects a bookmark based in part on a predetermined bookmark_distance, which is the same for each bookmark. The selecting step selects the bookmark 202 which is located at a particular position 416 in an ordered sequence of bookmarks, namely, the position is the given logical index divided by the bookmark_distance using integer division. Thus, some embodiments employ equidistant bookmarks. Bookmarks may be organized in a list, tree, array, or any other "ordered sequence".

In some embodiments, the runs 130 are organized in an array referred to here for convenience as all_runs 402, and the bookmarks 202 are organized in an array referred to here for convenience all_bookmarks 408. Other names may be used in a particular embodiment, as noted previously. Each bookmark 202 covers a contiguous range of logical indexes, and is thus identified by each of those indexes. Each bookmark 202 that is identified by a logical index i has a run_ordinal 410 (named such for convenience herein; other names are permitted) specifying the ordinal position 412 in all_runs of the run containing the value at logical index i. Each bookmark 202 identified by a logical index i also has a last_index 414 (named such for convenience herein) specifying the maximum logical index covered by the run at the bookmark's run_ordinal position in all_runs. The process selects 314 a bookmark in part by setting a bookmark_index (named such for convenience herein) to the given logical index divided by the bookmark_distance using integer division, and locating an initial run by setting a current_run (named such for convenience herein) to all_runs[all_bookmarks[bookmark_index].run_ordinal]. The parameter and variable names used herein, such as all_runs and last_index, are merely for convenience and other names may be used within a particular embodiment.

In some embodiments, the process includes creating 302 the structure 120 of run-length-encoded values. Some configurations do both encoding and decoding for random access.

In some embodiments, the creating step creates 302 the structure 120 of run-length-encoded values with an average_run_length 220 greater than sixty-four. The average_run_length is the sum of the count property 406 of all runs 130 in the structure 120, divided by the total number 128 of runs 130. This is an example of using 322 a heuristic to set average_run_length 220. It has been observed the process yields desirable results if the average_run_length exceeds 64 for the whole encoded stream.

Some embodiments of the process include specifying 306 the bookmark_distance; in other embodiments the bookmark_distance has already been specified. Some embodiments do both bookmark-generating and decoding for random access. Bookmarks 202 are generated 308 during run-length encoding of raw data in some embodiments, whereas bookmarks 20 are generated from an existing run-length encoding in other embodiments.

In some embodiments, the number of runs 130 in the structure 120 of run-length-encoded values is less than two to the twenty-third power, and the specifying step specifies 306 a bookmark_distance that is no greater than two to the seventh power. This is an example of using 322 a heuristic to specify bookmark_distance 218. It has been observed that if the total length of the encoded stream is lower than 16 million elements, then the process yields desirable results if the Bookmarks Density is lower or equal to 128.

Some embodiments provide a process for assisting identification of a target value located at a given logical index into a structure of run-length-encoded values. The process obtains 310 a current value 132 (e.g., from a value property 404 or other data storage), and a current count 134 (e.g., from a count property 406 or other data storage), which indicates how many times the current value is consecutively repeated in a raw data 136 source. The process generates 308 bookmarks 202. Each bookmark for a logical index i into the data source has a run_ordinal specifying the ordinal position in an array all_runs of the run containing the value at logical index i, and a last_index specifying the maximum logical index covered by the run at the bookmark's run_ordinal position in all_runs.

In some embodiments, the process obtains 310 current value and current count from a previously completed all_runs array. That is, in some configurations bookmarks are generated after the raw data has already been run-length encoded. In other embodiments, the process enters 304 the current value and the current count in the array all_runs. That is, in some configurations bookmarks are generated while the raw data is being run-length encoded.

Configured Media

Some embodiments include a configured computer-readable storage medium 112. Medium 112 may include disks (magnetic, optical, or otherwise), RAM, EEPROMS or other ROMs, and/or other configurable memory, including in particular non-transitory computer-readable media (as opposed to wires and other propagated signal media). The storage medium which is configured may be in particular a removable storage medium 114 such as a CD, DVD, or flash memory. A general-purpose memory, which may be removable or not, and may be volatile or not, can be configured into an embodiment using items such as bookmarks 202, bookmark-generating code 212, and/or bookmark-using code 214, in the form of data 118 and instructions 116, read from a removable medium 114 and/or another source such as a network connection, to form a configured medium. The configured medium 112 is capable of causing a computer system to perform process steps for transforming data through (de)compression, random access, and other operations as disclosed herein. FIGS. 1 through 8 thus help illustrate configured storage media embodiments and process embodiments, as well as system and process embodiments. In particular, any of the process steps illustrated in FIG. 3 or otherwise taught herein, may be used to help configure a storage medium to form a configured medium embodiment.

Additional Examples

Additional details and design considerations are provided below. As with the other examples herein, the features described may be used individually and/or in combination, or not at all, in a given embodiment.

FIG. 5 shows an exemplary RLE compressed data stream, in a table format. The table is interpreted as indicating that the uncompressed data 136 contains one hundred consecutive copies of value A, followed by forty-seven copies of B, followed by twenty-two copies of C, followed by forty-five copies of D, and so on, followed eventually by ninety-three copies of value Z. Some embodiments provide random access to target values in such a structure, by determining the value 132 at a specified logical index 138.

For example, consider ways to determine the value at position 155 in the combined values array. One approach has been to sum the length of each run: run A covers the first one hundred positions, run B covers positions 101-147, run C covers positions 147 to 169, and so on. Under this approach, the value sought (at index 155), is C's value. However, when random access operations are frequent and the number of RLE runs in the data structure is large (thousands or more), then the time required for summing up all lengths and determining the actual value can grow dramatically.

In some embodiments, using a bookmark 202 system saves the time needed to scan all the RLE runs from the beginning of the data structure 120 to the beginning of the range containing the value of interest. For example, some embodiments generate 308 a set of equidistant bookmarks 202 during RLE encoding, with each bookmark covering a contiguous range of indexes 138. Assuming that the distance between two bookmarks is 6, then two consecutive bookmarks, Bi and Bi+1 will cover the values at indexes in the interval [Bi*$\delta$, Bi+1*$\delta$). Finding the right bookmark for a random index is a matter of dividing that index value by bookmark_distance $\delta$.

In some embodiments, each bookmark 202 identified by an index i has two properties, namely, the ordinal of the RLE run containing the index it covers (ordinal 206), and the maximum logical index that is covered by the RLE run pointed by the ordinal (last index 208).

Assuming a bookmark distance of 55, the first part of a bookmark system for FIG. 5 is illustrated in FIG. 6. With such a bookmark structure (e.g., array all_bookmarks 408) populated once, a random access operation involves accessing the right bookmark for the specified index, and then sequentially scanning the RLE runs starting at the one indicated by the bookmark until the run containing the desired index is reached. The bookmark for the specified index is selected 314 by dividing the index by the bookmark distance. For instance, when looking for the value at index 155, 155/55=2, the result of the integer division.

Figure 7:
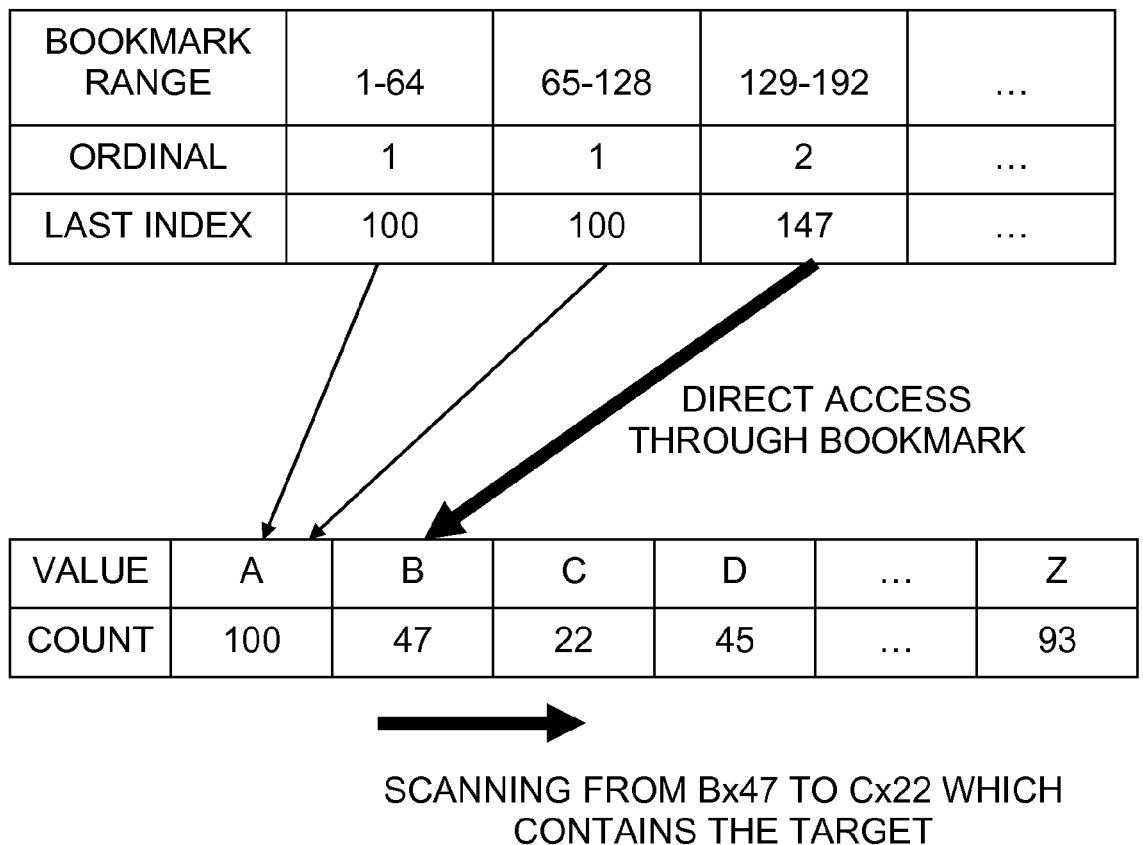
FIG. 7 is a diagram illustrating use of the FIG. 6 bookmark array to access a target value in the FIG. 5 run-length encoded structure.

FIG. 7 shows a bookmark 202 system for accessing an RLE stream. The bookmark distance in this example is 64. The highlighted arrows present the path followed by the algorithm to find the value at index 169. Direct access is made to run B through the bookmarks, instead of scanning and summing from the beginning of the structure 120 as described above. Then limited scanning is done from run B to run C, which contains the target value.

FIG. 8 presents a more detailed example, in the form of pseudo-code. In FIG. 8, comments are marked with a // prefix.

Experimentation with various data distributions led to some heuristics that can be used to help determine when a random access process is efficient against run-length encoding compression streams.

Some embodiments implement heuristic optimizations. An implementation of the process on a binary electronic computer may be tailored to reflect the observed fact that the performance of the bookmark system is improved if the distance between bookmarks is a power of 2. Determining the optimal number of bookmarks involves a trade off. On one hand, the more bookmarks in the system, the fewer RLE runs need to be sequentially scanned in a single sequence (between two consecutive bookmarks). On the other hand, the more bookmarks in the system, the worse the bookmark access performance tends to be, due to the typical computer architecture which allows fast memory access to relatively small caches, and slower memory access as the data volume grows.

Some embodiments use a heuristic to determine an optimal number of bookmarks and an optimal bookmark distance. Two metrics are used in these heuristics. One metric is the average_run_length. As mentioned previously, a run is a tuple (value, count), representing count successive occurrences of value. The average_run_length of a run-length encoding compressed stream is defined as the sum of the count property of all runs in the stream, divided by the total number of runs.

Considering the following example structure:

| VALUE | A | B | C | D | E |
|---|---|---|---|---|---|
| COUNT | 100 | 47 | 22 | 45 | 93 |

The average_run_length for this example structure is (100+47+22+45+93)/5, namely, 61.4.

Another metric is Bookmarks Density, namely, bookmark_distance—the distance (number of encoded elements) between two consecutive bookmarks.

Experimentally, the following heuristics were determined. First, the process yielded very good results if the average_run_length exceeded 64 for the whole encoded stream (structure 120). Second, if the total length of the encoded stream is lower than 16 million elements, then the process yielded very good results if the Bookmarks Density was lower or equal to 128. Third, a step of the random access algorithm is the division of the index by the bookmark distance. As mentioned previously, division by a power of 2 is particularly efficient on a binary electronic computer. Consequently, an optimized number of bookmarks is the smallest power of 2 which is greater than the total number of elements in the stream divided by 128 (second heuristic above). The number can be determined using Formula 1:

$$\text{Number of Bookmarks} = 2^{\lceil log_2(numElements/128) \rceil} \tag{1}$$

Note that $\lceil x \rceil$ denotes the minimum integral value greater than x. For example, $\lceil 3.5 \rceil$ is 4. One consequence of using the heuristics is that, on average, an encoded element will be accessed in at most two iterations after following the bookmark.

CONCLUSION

Although particular embodiments are expressly illustrated and described herein as processes, as configured media, or as systems, it will be appreciated that discussion of one type of embodiment also generally extends to other embodiment types. For instance, the descriptions of processes in connection with FIG. 3 also help describe configured media, and help describe the operation of systems and manufactures like those discussed in connection with other Figures. It does not follow that limitations from one embodiment are necessarily read into another. In particular, processes are not necessarily limited to the data structures and arrangements presented while discussing systems or manufactures such as configured memories.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific features of an example may be omitted, renamed, grouped differently, repeated, instantiated in hardware and/or software differently, or be a mix of features appearing in two or more of the examples. Functionality shown at one location may also be provided at a different location in some embodiments.

Reference has been made to the figures throughout by reference numerals. Any apparent inconsistencies in the phrasing associated with a given reference numeral, in the figures or in the text, should be understood as simply broadening the scope of what is referenced by that numeral.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims as filed are part of the specification.

While exemplary embodiments have been shown in the drawings and described above, it will be apparent to those of ordinary skill in the art that numerous modifications can be made without departing from the principles and concepts set forth in the claims. Although the subject matter is described in language specific to structural features and/or procedural acts, it is to be understood that the subject matter defined in the appended claims is not necessarily limited to the specific features or acts described above the claims. It is not necessary for every means or aspect identified in a given definition or example to be present or to be utilized in every embodiment. Rather, the specific features and acts described are disclosed as examples for consideration when implementing the claims.

All changes which come within the meaning and range of equivalency of the claims are to be embraced within their scope to the full extent permitted by law.

What is claimed is:

1. A process for identifying a target value from a given logical index into a structure of run-length-encoded values, the structure including runs which each have a value property and a count property indicating the number of times the value is repeated in uncompressed data, the process utilizing a device which has at least one logical processor and a memory in operable communication with the logical processor, the process performed using the processor and the memory, the process comprising the steps of:
   selecting a bookmark based on the given logical index, a maximum logical index of the bookmark, and a specified bookmark_distance;
   locating an initial run in the structure of run-length-encoded values, based on the selected bookmark;
   choosing, as a final run, a run which is within one bookmark_distance of the initial run and which covers a range of logical indexes that includes the given logical index; and
   identifying the target value as the value of the final run.

2. The process of claim 1, wherein:
   the selecting step selects a bookmark based in part on a predetermined bookmark_distance;
   the predetermined bookmark_distance is the same for each bookmark;
   the selecting step selects the bookmark which is located at a position in an ordered sequence of bookmarks; and
   the position is the given logical index divided by the bookmark_distance using integer division.

3. The process of claim 1, wherein:
   the runs are organized in an array all_runs;
   the bookmarks are organized in an array all_bookmarks;
   each bookmark covers a contiguous range of logical indexes, and is thus identified by each of those indexes;
   each bookmark identified by a logical index i has a run_ordinal specifying the ordinal position in all_runs of the run containing the value at logical index i;
   each bookmark identified by a logical index i also has a last_index specifying the maximum logical index covered by the run at the bookmark's run_ordinal position in all_runs;
   selecting a bookmark comprises setting a bookmark_index to the given logical index divided by the bookmark_distance using integer division; and
   locating an initial run comprises setting a current_run to all_runs[all_bookmarks[bookmark_index].run_ordinal].

4. The process of claim 1, further comprising creating the structure of run-length-encoded values.

5. The process of claim 4, wherein the creating step creates the structure of run-length-encoded values with an average_run_length greater than sixty-four, the average_run_length being the sum of the count property of all runs in the structure, divided by the total number of runs.

6. The process of claim 1, further comprising specifying the bookmark_distance.

7. The process of claim 6, wherein the number of runs in the structure of run-length-encoded values is less than two to the twenty-third power, and the specifying step specifies a bookmark_distance no greater than two to the seventh power.

8. A computer-readable non-transitory storage medium configured with data and with instructions that when executed by at least one processor causes the at least one processor to perform a process for assisting identification of a target value located at a given logical index into a structure of run-length-encoded values, the process comprising the steps of:
   obtaining a current value, and a current count which indicates how many times the current value is consecutively repeated in a data source;
   generating bookmarks, each bookmark for a logical index i into the data source having a run_ordinal specifying the ordinal position in an array all_runs of the run containing the value at logical index i, the bookmark also having a last_index specifying the maximum logical index covered by the run at the bookmark's run_ordinal position in all_runs.

9. The configured computer-readable storage medium of claim 8, wherein the process obtains current value and current count from a previously completed all_runs array.

10. The configured computer-readable storage medium of claim 8, wherein the process comprises entering the current value and the current count in the array all_runs.

11. The configured computer-readable storage medium of claim 8, wherein the array all_runs is completed with an average_run_length greater than sixty-four, the average_run_ length being the sum of the count property of all runs in the array, divided by the total number of runs.

12. The configured computer-readable storage medium of claim 8, wherein the number of runs in the array all_runs is less than two to the twenty-third power, and the specifying step specifies a bookmark_distance no greater than two to the seventh power, the bookmark_distance of a bookmark specifying the number of logical index values covered by the bookmark.

13. The configured computer-readable storage medium of claim 8, wherein each bookmark covers a contiguous range of bookmark_distance logical indexes, and bookmark_distance is a positive integer power of two.

14. A run-length-encoding management system comprising:
   at least one logical processor;
   at least one memory in operable communication with the logical processor;
   an array all_runs of run-length-encoded values residing in memory and accessible to the logical processor, all_runs including runs which each have a value property and a count property indicating the number of times the value is repeated in an uncompressed data source; and
   a set of bookmarks residing in memory and accessible to the logical processor, each bookmark for a logical index i into the data source having a run_ordinal specifying the ordinal position in the array all_runs of the run containing the value at logical index i, the bookmark also having a last_index specifying the maximum logical index covered by the run at the bookmark's run_ordinal position in all_runs.

15. The system of claim 14, further comprising code residing in memory and configured to access a value at a logical index i supplied to the code as a parameter, the code configured to use the bookmark(s) to locate the value in the array all_runs.

16. The system of claim 15, wherein the code is configured to use the bookmark(s) by:
   selecting a bookmark based on the given logical index parameter and a specified bookmark_distance;
   locating an initial run in the array all_runs based on the selected bookmark;
   choosing, as a final run, a run which is within one bookmark_distance of the initial run and which covers a range of logical indexes that includes the given logical index; and
   identifying the target value as the value of the final run.

17. The system of claim 15, wherein the code is configured to use the bookmark(s) by selecting the bookmark which is located at a position in an ordered sequence of bookmarks, the position being the given logical index parameter divided by a predetermined bookmark_distance using integer division.

18. The system of claim 15, wherein:
   each bookmark covers a contiguous range of bookmark_distance logical indexes, and is thus identified by each of those indexes;
   each bookmark identified by a logical index i has a run_ordinal specifying the ordinal position in all_runs of the run containing the value at logical index i;
   each bookmark identified by a logical index i also has a last_index specifying the maximum logical index covered by the run at the bookmark's run_ordinal position in all_runs; and
   the code is configured to use the bookmark(s) by selecting a bookmark as the given logical index parameter divided by the bookmark_distance using integer division, and by locating an initial run as all_runs[all_bookmarks[bookmark_index].run_ordinal].

19. The system of claim 15, wherein each bookmark covers a contiguous range of bookmark_distance logical indexes, and bookmark_distance is a positive integer power of two.

20. The system of claim 14, further comprising code residing in memory and configured to generate the bookmark(s).

* * * * *